(12) United States Patent
Nguyen et al.

(10) Patent No.: US 9,893,724 B2
(45) Date of Patent: Feb. 13, 2018

(54) ISOLATED OUTPUT SWITCHING CIRCUIT

(71) Applicant: TEXAS INSTRUMENTS INCORPORATED, Dallas, TX (US)

(72) Inventors: Tri C. Nguyen, Garland, TX (US); Md. Abidur Rahman, Richardson, TX (US); David J. Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 15/180,775

(22) Filed: Jun. 13, 2016

(65) Prior Publication Data

US 2017/0033785 A1    Feb. 2, 2017

Related U.S. Application Data

(60) Provisional application No. 62/199,691, filed on Jul. 31, 2015.

(51) Int. Cl.
| | |
|---|---|
| *H03K 17/16* | (2006.01) |
| *H03K 17/284* | (2006.01) |
| *H01L 27/092* | (2006.01) |
| *H03K 5/07* | (2006.01) |
| *H03K 5/08* | (2006.01) |
| *H03K 17/06* | (2006.01) |

(52) U.S. Cl.
CPC ....... *H03K 17/162* (2013.01); *H01L 27/0928* (2013.01); *H03K 5/07* (2013.01); *H03K 5/08* (2013.01); *H03K 17/163* (2013.01); *H03K 17/284* (2013.01); *H03K 2017/066* (2013.01)

(58) Field of Classification Search
CPC ...... H03K 17/162; H03K 17/284; H03K 5/07; H03K 5/08; H01L 27/0928; H01L 29/0619
USPC ................................................ 327/306–310
See application file for complete search history.

(56) References Cited

U.S. PATENT DOCUMENTS

| | | | |
|---|---|---|---|
| 4,905,067 A | 2/1990 | Morelli et al. | |
| 9,019,001 B2 * | 4/2015 | Kelley | H03K 17/04123 |
| | | | 327/108 |
| 9,453,859 B2 * | 9/2016 | Ribarich | G01R 31/40 |

* cited by examiner

*Primary Examiner* — Dinh T Le
(74) *Attorney, Agent, or Firm* — Lawrence J. Bassuk; Charles A. Brill; Frank D. Cimino

(57) ABSTRACT

A semiconductor device includes an output switching device having an input node, an output node, and a control input node. The control input node enables an input voltage applied to the input node to be switched to the output node. A gate pull-down circuit controls the control input node of the output switching device in response to at least one control signal. The gate pull-down circuit activates the output switching device by raising the voltage level of the control input node above the voltage level of the output node and deactivates the output switching device by clamping the control input node to the voltage level of the output node. A gate pull-up circuit receives an enable signal and generates the at least one control signal to the gate pull-down circuit in response to the enable signal.

20 Claims, 6 Drawing Sheets

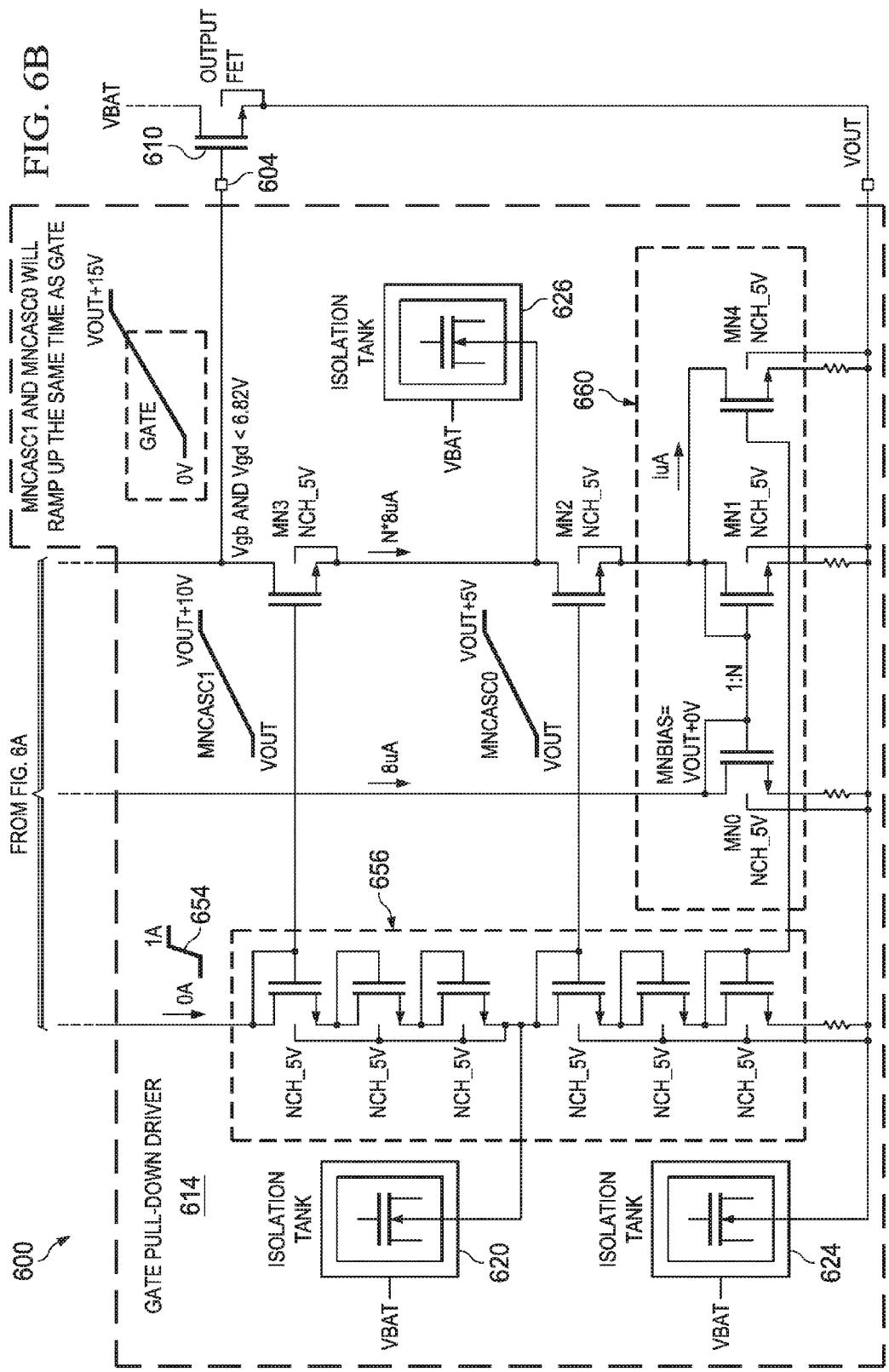

ISOLATED OUTPUT SWITCHING CIRCUIT

CROSS-REFERENCE TO RELATED APPLICATION

This application claims the benefit of U.S. Provisional Patent Application 62/199,691, filed on Jul. 31, 2015, and entitled ISOLATED FLOATING GATE PULL DOWN DRIVER FOR INDUCTIVE LOAD SWITCHES USING STANDARD PROCESS FLOW, the entirety of which is incorporated by reference herein.

TECHNICAL FIELD

This disclosure relates to integrated circuits and more particularly to an isolated output switching circuit.

BACKGROUND

When driving inductive applications via a load switching device, the output voltage can drop below ground significantly when the switching device is turned off. For example, modern automotive load switching devices utilize an external resistor and external diode to isolate the local ground in a controller chip driving the load switching device from a global ground associated with the inductive load. The local ground can "fly" as far below the global ground as required to hold the output switching device (e.g., FET Vgs) at zero volts when inductive loads are switched off. When the local GND flies negative, a prodigious amount of noise can be seen in the controller chip via the local ground path. In multi-channel load switch applications, one voltage source (e.g., battery) feeds multiple output voltages—each output driving its own load. If one load is inductive and the other loads are not, then the inductive load can couple noise onto the other output voltages of adjacent channels via the local ground flying negative when the inductive load on a respective channel is switched.

SUMMARY

This disclosure relates to an isolated output switching circuit that discharges a control input of a switching device by clamping the control input of the device to an output voltage level of the device.

In one example, a semiconductor device includes an output switching device having an input node, an output node, and a control input node. The control input node enables an input voltage applied to the input node to be switched to the output node. A gate pull-down circuit controls the control input node of the output switching device in response to at least one control signal. The gate pull-down circuit activates the output switching device by raising the voltage level of the control input node above the voltage level of the output node and deactivates the output switching device by clamping the control input node to the voltage level of the output node. A gate pull-up circuit receives an enable signal and generates the control signal to the gate pull-down circuit in response to the enable signal.

In another example, a semiconductor device includes an output switching device having an input node, an output node, and a control input node. The control input node enables an input voltage applied to the input node to be switched to the output node. A gate pull-down circuit controls the control input node of the output switching device in response to at least one control signal. The gate pull-down circuit includes at least one transistor device to apply a voltage to the control input node to activate and deactivate the output switching device. A gate pull-up circuit receives an enable signal and generates the control signal to the gate pull-down circuit in response to the enable signal. A slope control circuit controls a slope of the rise and fall time of the at least one control signal such that a breakdown voltage of the at least one transistor device is below a predetermined threshold.

In yet another example, a semiconductor device includes an output switching device having an input node, an output node, and a control input node. The control input node enables an input voltage applied to the input node to be switched to the output node. A gate pull-down circuit controls the control input node of the output switching device in response to at least one control signal. The gate pull-down circuit employs at least one transistor device to activate the output switching device by raising the voltage level of the control input node above the voltage level of the output node and deactivate the output switching device by clamping the control input node to the voltage level of the output node. A gate pull-up circuit receives an enable signal and generates the control signal to the gate pull-down circuit in response to the enable signal. A slope control circuit in the gate pull-up circuit controls a slope of the rise and fall time of the control signal such that a breakdown voltage of the transistor device is below a predetermined threshold.

BRIEF DESCRIPTION OF THE DRAWINGS

FIGS. 6A and 6B illustrate an example circuit diagram of an isolated output switching circuit.

DETAILED DESCRIPTION

Figure 1:
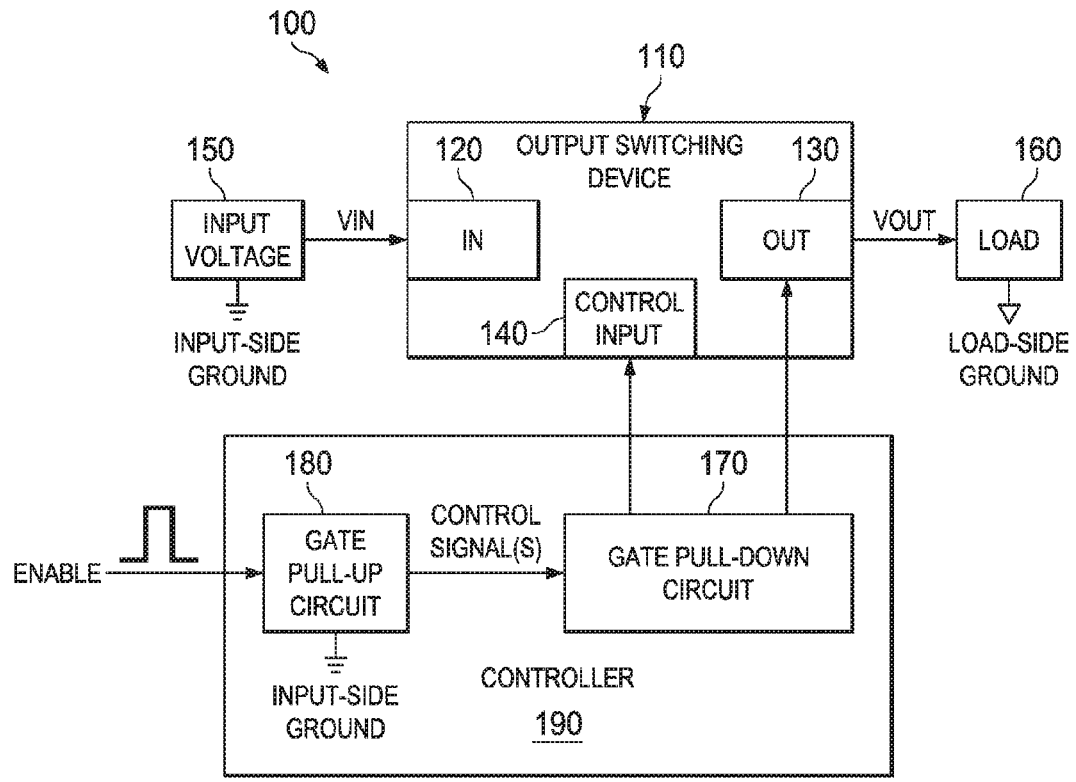
FIG. 1 illustrates an example schematic block diagram of an isolated output switching circuit.

This disclosure relates to an isolated output switching circuit. The switching circuit includes an output switching device having an input node, an output node, and a control input node. A gate pull-down circuit is employed to control the control input node of the output switching device in response to a control signal (or signals) that can include output current from one or more current sources. The gate pull-down circuit activates the output switching device (e.g., switches input voltage on input node to output node) by raising the voltage level of the control input node above the voltage level of the output node. The gate pull-down circuit can be controlled via an isolated gate pull-up circuit that receives an enable signal and generates the control signal to control the gate pull-down circuit in response to the enable signal.

In contrast to prior switch control schemes, however, rather than pull the control input down to a common ground connection for deactivation, the gate pull-down circuit deactivates the output switching device by clamping the control input node to the voltage level of the output node. In this manner, inductive fly back voltages, which may be induced when turning off inductive loads at the output node of the switching device, are prevented from disrupting other switching circuits via the common ground connection and associated coupling. Additionally, the gate control circuit can be implemented with multiple smaller devices (e.g., having lower breakdown voltages than larger devices typically used) to perform the activation and deactivation of the switching device. By using smaller transistors having lower breakdown voltages, semiconductor real estate can be conserved which mitigates cost in semiconductor processing.

The gate pull-up circuit can include a slope control circuit to control a rate of change (e.g., slope) of the rise and fall time of the control signal such that a breakdown voltage of control transistor devices in the gate-pull-down circuit is controlled below a predetermined threshold. By controlling the slope of the control signal, the input to output voltage differential of the control transistor device can be controlled below its breakdown voltage. The slope control circuit in the gate pull-up circuit can also delay turn-off of the control transistor device in the gate pull-down circuit, which in turn allows additional time for an inductive load connected to the output node to fully discharge during deactivation of the output switching device to further reduce noise.

Isolation noise reduction can be facilitated by fabricating transistors in the gate-pull down circuit (e.g., in SPWELL region) within an isolation region (e.g., P_EPI region) of the semiconductor. This includes further surrounding the isolation region via an oppositely doped well region (e.g., NWELL) to form isolation diode regions around the respective transistors to mitigate the transmission and reception of noise between adjacent switching channels.

FIG. 1 illustrates an example of an isolated output switching circuit 100. The output switching circuit 100 discharges a control input of an output switching device 110 by clamping the control input of the device to an output voltage level of the device. As used herein, the term circuit can include a collection of active and/or passive elements that perform a circuit function such as an analog circuit or control circuit, for example. Additionally or alternatively, the term circuit can include an integrated circuit where all and/or some of the circuit elements are fabricated on a common substrate, for example.

As shown in the example of FIG. 1, the output switching device 110 includes input node 120, an output node 130, and a control input node 140. The control input node 140 enables an input voltage 150 applied to the input node 120 to be switched to the output node 130 that drives a load 160. The load 160 can be a resistive load, inductive load, a capacitive load or a combination thereof. As shown, the load 160 is coupled to a load-side ground (e.g., chassis ground) that is isolated from an input side ground (e.g., circuit ground) such as associated with the input voltage 150 and/or other input-side circuits described herein. In one example, the input voltage 150 can be a battery voltage but other voltage sources are possible (e.g., switched supply voltages, regulated DC voltages, and so forth).

A gate pull-down circuit 170 controls the control input node 140 of the output switching device 110 in response to one or more control signals. The gate pull-down circuit 170 activates the output switching device 110 by raising the voltage level of the control input node 140 above the voltage level of the output node 130. As used herein, the term activate refers to switching action in the output switching device that effectively forms a low-impedance path between the input node 120 and the output node 130. The term deactivate refers to switching action that effectively disconnects the path between the input node 120 and the output node 130. The gate pull-down circuit 170 deactivates the output switching device 110 by clamping the control input node 140 to the voltage level of the output node 130. As noted previously, in contrast to prior switch control schemes, which typically would pull the control input node 140 down to a local ground connection for deactivation, the gate pull-down circuit 170 deactivates the output switching device 110 by clamping the control input node 140 to a level that approximates the voltage level of the output node 130 to turn off the device. In this manner, inductive fly back voltages that are induced when turning off inductive loads 160 at the output node 130 of the output switching device 110 are mitigated from disrupting other switching circuits via the local ground connection and associated coupling. A multichannel switching circuit is illustrated with respect to FIG. 4 where inductive fly back voltages generated in one circuit are mitigated from appearing in adjacent switching circuits.

In the example of FIG. 1, a gate pull-up circuit 180 receives an enable signal and generates the control signal (or signals) to the gate pull-down circuit 170 in response to the enable signal. The gate pull-down circuit 170 includes at least one transistor device to apply a voltage to the control input node 140 to activate and deactivate the output switching device 110. As shown, the combination of the gate pull-down circuit 170 and the gate pull-up circuit can be implemented as a controller 190 that share a common semiconductor substrate. In other examples (see, e.g., FIG. 4), a single controller can support multiple gate-pull-down/pull-up circuits to control multiple switching channels for driving more than one load. The gate pull-up circuit 180 also includes slope control that controls the rise and fall characteristics of the control signal applied to the gate pull-down circuit 170. The slope control provides a controlled rise and fall time signal applied to drive transistors in the gate pull-down circuit 170. This allow the inputs of the drive transistors to rise more slowly and in line with the rise time of the output signal of the drive transistor which controls the input and output voltage differential across the drive transistor(s). This allows for utilizing smaller drive transistor devices having lower breakdown voltages and thus conserving semiconductor real estate. These and other isolation aspects are described below with respect to FIGS. 6 and 7.

Figure 2:
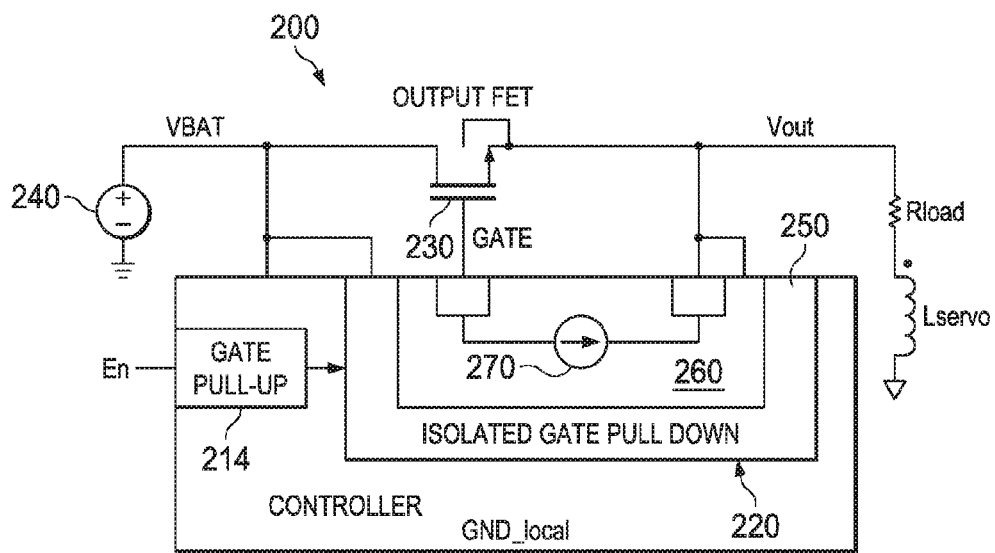
FIG. 2 illustrates another example schematic circuit diagram of an isolated output switching circuit.

FIG. 2 illustrates an example of an isolated output switching circuit 200 that discharges a control input of an output switching device by clamping the control input of the device to an output voltage level of a single device. In this example, a controller 210 includes a gate pull-up circuit 214 and a gate pull-down circuit 220 that collectively control an output switching device shown as FET 230. The FET 230 drives a series resistor RLOAD and inductor LSERVO connected to a load-side ground. A battery source 240 provides input power to the FET 230 and is connected to a circuit side ground. The load-side ground and the circuit-side ground are electrically isolated from each other.

The controller 210 can be coupled through a resistor R_EXT and DIODE_EXT to the local circuit ground. The external diode DIODE_EXT provides protection in the event that the battery source 240 is misconnected. In order to further isolate the gate-pull-down circuit 220, various semiconductor isolation regions can be fabricated to facilitate such isolation (e.g., between adjacent switching channels). The gate pull-down circuit 220 can include a NWELL region that 250 that surrounds and P-type isolation tank 260, where an arrow symbol 270 represents various transistors in the gate-pull down circuit that are formed in a Shallow P Type Well (SPWELL) region of the semiconductor. The NWELL 250 can be coupled to the source 240 whereas the isolation tank 260 can be coupled to VOUT, where the NWELL and P isolation portions form reverse bias diode regions to provide further isolation. Such regions are disclosed herein with respect to FIG. 7. The various transistors represented at 270 of the gate-pull down circuit 220 include drive transistors to operate the FET 230. Slope control circuits in the gate pull-up circuit 214 provide a controlled rise and fall time signal applied to the drive transistors in the gate pull-down circuit 220. As noted previously, this allow the inputs of the drive transistors to rise more slowly and in line with the rise time of the output signal of the drive transistor which controls the input and output voltage differential across the drive transistor(s). This allows for utilizing smaller drive transistor devices having lower breakdown voltages and thus conserving semiconductor real estate.

Figure 3:
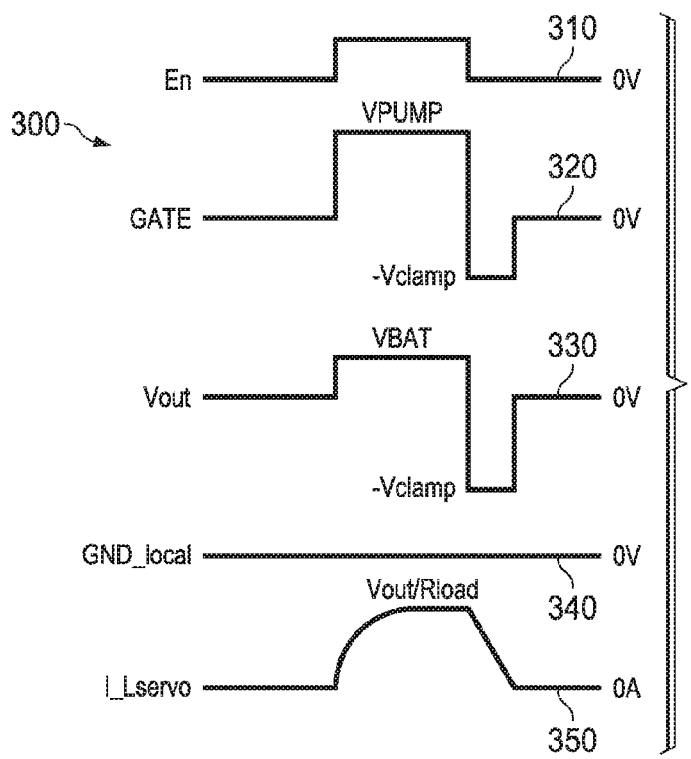
FIG. 3 illustrates an example voltage and timing diagram for the circuit depicted in FIG. 2.

FIG. 3 illustrates an example voltage and timing diagram 300 for the circuit depicted in FIG. 2. At 310, an enable signal EN is shown which is applied to the gate pull-up circuit 214 of FIG. 2. At 320, the gate drive to the output FET 230 is shown. When the EN signal goes low, the gate drive goes negative in response to inductor fly back action of the circuit. The output voltage to the load is shown at 330 and substantially follows the drive signal of the gate and in response to the enable signal EN. As shown, the local ground is substantially undisturbed at 340 due to the negative response on the output and the gate. Signal 350 shows the inductor voltage across LSERVO in response to the enable signal EN.

Figure 4:
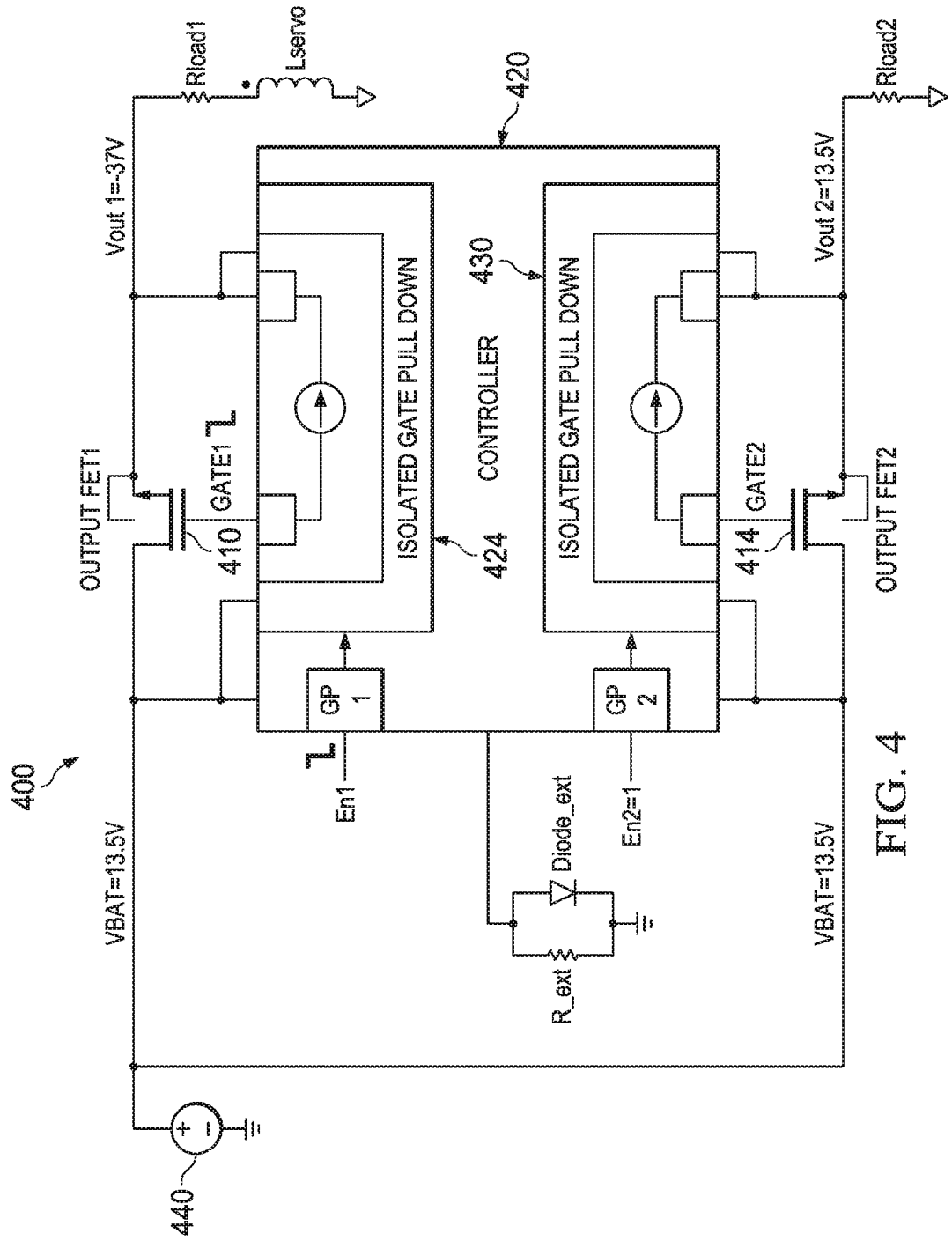
FIG. 4 illustrates yet another example schematic circuit diagram of an isolated output switching circuit.

FIG. 4 illustrates an example of an isolated output switching circuit 400 that discharges a control input of multiple output switching devices 410 and 414. In this example, a single controller 420 includes two channels to drive the switching devices 410 and 414. More than two channels can be similarly provided in the controller 420. The first channel includes gate pull-up 1, shown as GP 1, which drives gate-pull-down 424 to control output switching device 410. The second channel includes gate pull-up 2, shown as GP 2, which drives gate-pull-down 430 to control output switching device 414. Each switching device 410 and 414 receives a common battery source 440. In this example, the switching device 410 drives a series resistor and inductive load whereas the switching device 414 of the second channel drives a resistive load.

Figure 5:
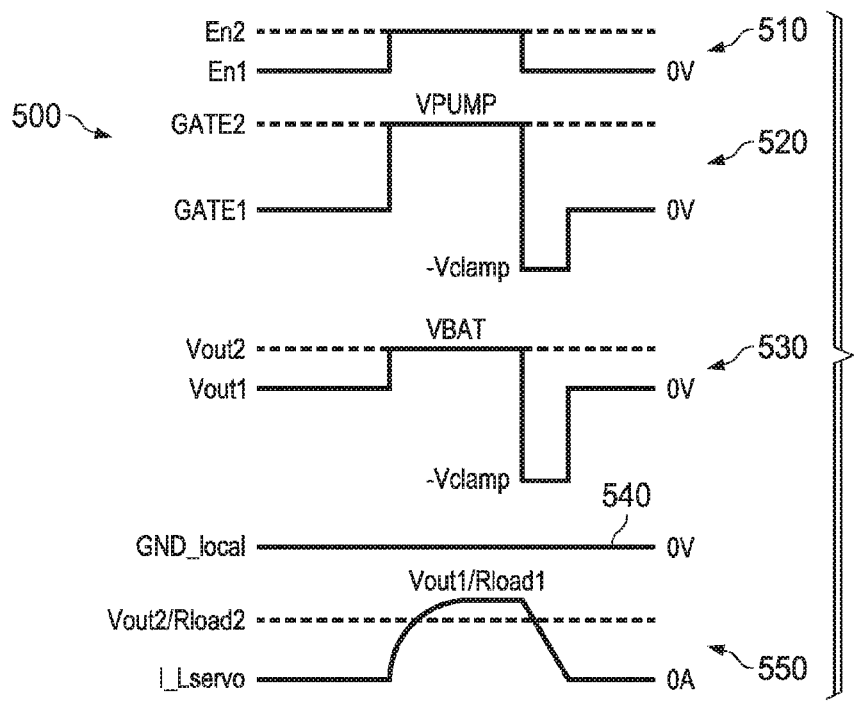
FIG. 5 illustrates an example voltage and timing diagram for the circuit depicted in FIG. 4.

FIG. 5 illustrates an example voltage and timing diagram 500 for the circuit depicted in FIG. 4. This example demonstrates a situation where switching of inductive loads in one channel has minimal impact to an adjacent channel. At 510, an enable EN1 for the first channel is pulsed while the enable EN2 remains inactive. At 520, the respective gate drive pulses for transistor 410 and 414 are shown in response to the respective enables EN1 and EN2. At 530, the respective output voltages for each channel are shown in response to the respective enables EN1 and EN2. As a result of the isolation afforded by the circuit 400, voltage responses of the first channel output voltage VOUT1 do not impact the adjacent output VOUT2. At 540, local ground voltage remain substantially constant near zero volts illustrating that inductive fly back voltages from one channel are not communicated to an adjacent channel via ground. At 550, the respective load voltage responses are shown for each channel showing that the inductive load of the first channel does not substantially impact the resistive load of the adjacent channel.

Figure 6A:
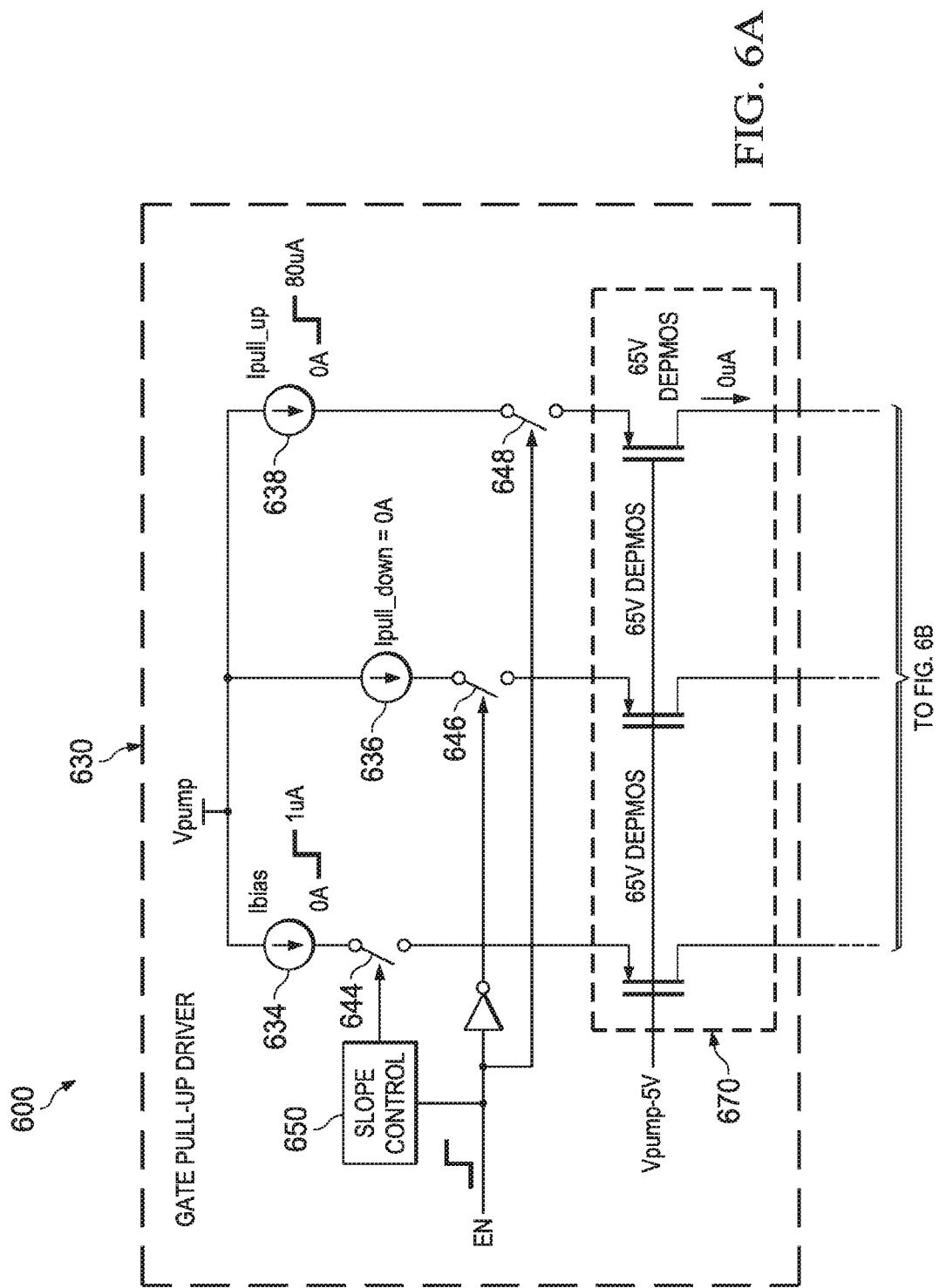

FIGS. 6A and 6B illustrate an example of an isolated output switching circuit 600 that discharges a control input 604 of an output switching device 610 by clamping the control input of the device to an output voltage level of the device. The output switching device 610 includes an input node shown as a drain connection, an output node shown as source connection, and the control input node 604 shown as a gate connection to the switching device 610. The control input node 604 enables an input voltage, shown as VBAT, applied to the input node to be switched to the output node. A gate pull-down circuit 614 controls the control input node 604 of the output switching device 610 in response to at least one control signal. The gate pull-down circuit 614 employs at least one transistor device to activate the output switching device 610 by raising the voltage level of the control input node 604 above the voltage level of the output node and deactivate the output switching device by clamping the control input node to the voltage level of the output node. In this example, two series transistor devices MN2 and MN3 operate in series to drive the gate (e.g., control node) of device 610. The dotted line surrounding the circuit 614 represents an NWELL region for isolation that operates with and an isolation tank which is symbolically represented at 620, 624, and 626. Each transistor in the circuit 614 can be formed in an SPWELL area that resides in the isolation tank, such as illustrated and described below with respect to FIG. 7.

A gate pull-up circuit 630 receives an enable signal EN and generates at least one control signal to the gate pull-down circuit in response to the enable signal. In this example, the control signals are driven via current sources 634, 636, and 638 which are switched via switches 644, 646, and 648, respectively in response to the enable signal EN. A slope control circuit 650 in the gate pull-up circuit to controls a slope of the rise and fall time of the control signal (e.g., slope of how fast current from current source can increase and decrease) such that a breakdown voltage of the transistor device in the gate pull-down circuit 614 is below a predetermined threshold. In this example, the rise and fall time of control signal 654 is controlled via the slope control circuit 650. As the control signal is applied to a divider network of transistors at 656, slope signals MNCASC0 and MNCASC1 are generated and applied to MN2 and MN3 respectively. By controlling the rise and fall times of MNCASC0 and MNCASC1, the input to MN2 and MN3 to more closely track the rise in output voltage shown at 658. In this manner, the output voltage differential across MN2 and MN3 from gate to drain does not exceed the breakdown voltage of the respective device. Thus, smaller devices can be employed in the circuit which conserves semiconductor real estate. In this example, 5V devices are used thought the circuit 614 having voltage gate-to-source and voltage gate-to-body breakdown voltages that should not exceed 6.8 volts, for example. Other transistor types (e.g., 3.3 V device) having different break down voltages are possible.

By controlling the fall-time of the MNCASC signals as well, output inductors can be allowed to fully discharge before the switching device 610 is turned off. The slope control circuit 650 can include a filter (e.g., including at least a resistor and capacitor) to control the rise and fall time of the current control signal 654 through the device 656. The breakdown voltage relates to a voltage between a gate and drain of the transistor devices in the circuit 614 or relates to a voltage between the gate and a body diode connection to the respective devices.

The gate pull-down circuit 614 includes a series of coupled transistor devices in the divider 656 that receive a bias current from the gate pull-up circuit 630 to provide a bias voltage to a control input of the transistor devices MN2 and MN3. A bias circuit 660 having a current mirror MN0 and MN1 enable a predetermined minimum bias current to flow (e.g., 1 uA) via MN4 though the transistor devices MN2/MN3 when the output switching device is activated and provide a predetermined pull-down current to the transistor devices MN2/MN3 when the output switching device is deactivated (e.g., 8 uA).

Each transistor device in the gate pull-down circuit 614 can be fabricated on an SPWELL area of a semiconductor substrate. The SPWELL area can be formed within an isolation epitaxial (EPI) layer that is formed between an NWELL ring. The isolation EPI layer and the NWELL ring form an isolation diode to provide voltage isolation to an adjacent switching channel (see, e.g., FIG. 7). A distance dimension between the SPWELL area and the NWELL ring can be controlled to a predetermined distance to provide a predetermined isolation voltage range to the adjacent switching channel.

The gate pull-up circuit 630 includes the first current source 634 that is switched via switch 644 in response to the enable signal EN to supply the bias current to the series of coupled transistor devices at divider 656. The second current source 636 is switched via switch 646 in response to the enable signal EN to supply pull-down current (e.g., 8 uA) to the bias circuit when the output switching device is deactivated. The third current source 638 is switched in response to the enable signal EN to supply pull-up current (e.g., 80 uA) to the transistor devices MN2 and MN3 when the output switching device 610 is activated. As shown, a set of isolation transistor devices at 670 (e.g., 65 v DEPMOS devices) can be provided to pass current from the respective current sources 634-638 in the gate pull-up circuit 630 to the gate pull-down circuit 614.

Figure 7:
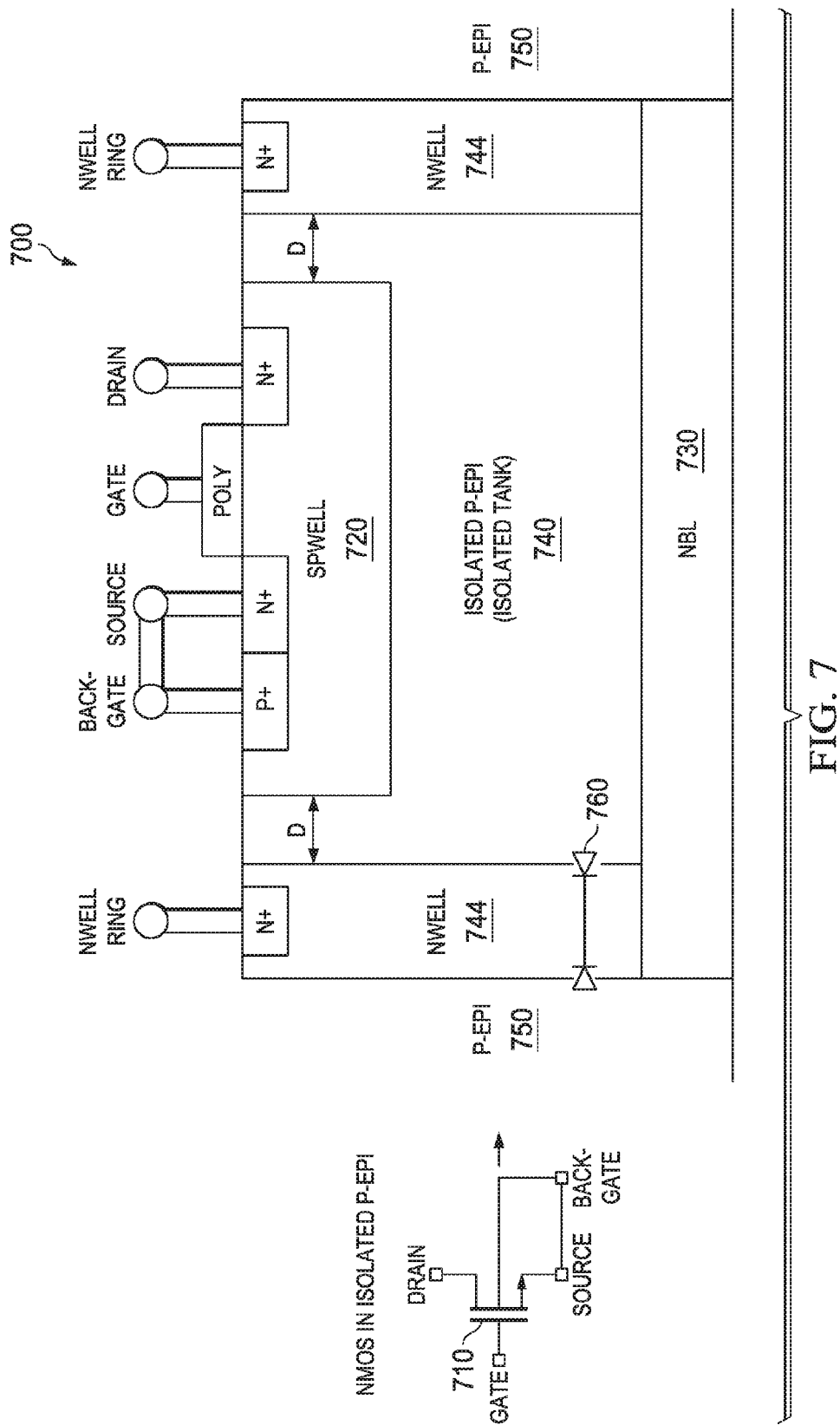
FIG. 7 illustrates an example semiconductor cross section diagram of a single transistor depicted in the gate pull-down circuit of FIG. 6.

FIG. 7 illustrates an example semiconductor cross section 700 of a single transistor depicted in the gate pull-down circuit of FIG. 6. By way of example, a single transistor device 710 is shown, which can represent any of the transistors represented in the gate pull-down circuit of FIG. 6. The transistor device 710 includes a gate, connection, a drain connection, and a source connection that is coupled to a body or back-gate connection of the device. Each transistor device in the gate pull-down circuit of FIG. 6 can be fabricated on a Shallow P Type Well (SPWELL) area 720 of the semiconductor 700, where an NBL layer 730 (N-BURIED layer) forms a substrate of the semiconductor. The SPWELL area 720 is formed within an isolation epitaxial (EPI) region 740 (e.g., isolation tank) that is formed between an NWELL ring 744. The isolation EPI layer 740 and the NWELL ring 744 form an isolation diode to provide voltage isolation to an adjacent switching channel shown at 750. A symbolic representation of the formed isolation diode is shown at 760. As described previously, the NWELL ring 744 can be connected to the input source voltage whereas the isolation region 740 can be connected to the output voltage VOUT. The respective gain, drain, source and back gate regions of the device 710 are shown as formed into the SPWELL area 720. A distance "D" can be provided between the SPWELL area 720 and the NWELL ring 744, which dimension is controlled to a predetermined distance to provide a predetermined isolation voltage range to the adjacent switching channel. An example distance D can include approximately 6 design units, where one micron distance equals approximately 35 design units. Different design units can be utilized in other examples.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A semiconductor device comprising:
    an output switching device having an input node, an output node, and a control input node, the control input node enables an input voltage applied to the input node to be switched to the output node;
    a gate pull-down circuit to control the control input node of the output switching device in response to at least one control signal, the gate pull-down circuit activates the output switching device by raising the voltage level of the control input node above the voltage level of the output node and deactivates the output switching device by clamping the control input node to the voltage level of the output node; and
    a gate pull-up circuit that receives an enable signal and generates the at least one control signal to the gate pull-down circuit in response to the enable signal.

2. The semiconductor device of claim 1, wherein the gate pull-down circuit includes at least one transistor device to apply a voltage to the control input node to activate and deactivate the output switching device.

3. The semiconductor device of claim 2, wherein the gate pull-up circuit further comprises a slope control circuit to control a slope of the rise and fall time of the at least one control signal such that a breakdown voltage of the at least one transistor device is below a predetermined threshold.

4. The semiconductor device of claim 3, wherein the slope control circuit includes at least a resistor and capacitor filter to control the rise and fall time of the at least one control signal and the breakdown voltage relates to a voltage between a gate and drain of the at least one transistor device or relates to a voltage between the gate and a body diode connection to the at least one transistor device.

5. The semiconductor device of claim 4, wherein the at least one transistor device is delayed from turning off by the response of the resistor and capacitor filter in the slope control circuit to allow an inductive load connected to the output node to discharge during deactivation of the output switching device.

6. The semiconductor device of claim 5, the gate pull-down circuit further comprising:
    a series of coupled transistor devices that receive a bias current from the gate pull-up circuit to provide a bias voltage to a control input of the at least one transistor device; and
    a bias that receives a voltage from the series of coupled transistor devices, the bias circuit includes a current mirror to enable a predetermined minimum bias current to flow though the at least one transistor device when the output switching device is activated and provide a predetermined pull-down current to the at least one transistor device when the output switching device is deactivated.

7. The semiconductor device of claim 6, wherein each transistor device in the gate pull-down circuit is fabricated on an P type well (SPWELL) area of a semiconductor, the SPWELL area formed within an isolation epitaxial (EPI) region that is formed between an N type well (NWELL) ring, the isolation EPI region and the NWELL ring form an isolation diode to provide voltage isolation to an adjacent switching channel.

8. The semiconductor device of claim 7, wherein a distance between the SPWELL area and the NWELL ring is controlled to a predetermined distance to provide a predetermined isolation voltage range to the adjacent switching channel.

9. The semiconductor device of claim 6, wherein the gate pull-up circuit further comprises:
   a first current source coupled to a voltage source to drive the series of coupled transistor devices, the first current source is switched in response to the enable signal to supply the bias current to the series of coupled transistor devices;
   a second current source coupled to the voltage source to drive the bias circuit, the second current source is switched in response to the enable signal to supply pull-down current to the bias circuit when the output switching device is deactivated; and
   a third current source coupled to the voltage source to drive the at least one transistor device in the gate-pull-down circuit, the third current source is switched in response to the enable signal to supply pull-up current to the at least one transistor device when the output switching device is activated.

10. The semiconductor device of claim 9, further comprising a set of isolation transistor devices connected to the first, second, and third current source to pass current from the respective current sources in the gate pull-up circuits to the gate pull-down circuit.

11. The semiconductor device of claim 1, further comprising at least one other gate pull-down circuit and at least one other gate pull-up circuit coupled to activate and deactivate at least one other output switching device.

12. The semiconductor device of claim 1, wherein the output switching device comprises a bipolar junction transistor or a field effect transistor.

13. A semiconductor device comprising:
   an output switching device having an input node, an output node, and a control input node, the control input node enables an input voltage applied to the input node to be switched to the output node;
   a gate pull-down circuit to control the control input node of the output switching device in response to at least one control signal, the gate pull-down circuit includes at least one transistor device to apply a voltage to the control input node to activate and deactivate the output switching device;
   a gate pull-up circuit that receives an enable signal and generates the at least one control signal to the gate pull-down circuit in response to the enable signal; and
   the gate pull-up circuit comprising a slope control circuit to control a slope of the rise and fall time of the at least one control signal such that a breakdown voltage of the at least one transistor device is below a predetermined threshold.

14. The semiconductor device of claim 13, wherein the gate pull-down circuit activates the output switching device by raising the voltage level of the control input node above the voltage level of the output node and deactivates the output switching device by clamping the control input node to the voltage level of the output node.

15. The semiconductor device of claim 13, wherein the slope control circuit includes a filter comprising at least a resistor and capacitor to control the rise and fall time of the at least one control signal and the breakdown voltage relates to a voltage between a gate and drain of the at least one transistor device or relates to a voltage between the gate and a body diode connection to the at least one transistor device.

16. The semiconductor device of claim 13, the gate pull-down circuit further comprising:
   a series of coupled transistor devices that receive a bias current from the gate pull-up circuit to provide a bias voltage to a control input of the at least one transistor device; and
   a bias circuit that receives a voltage from the series of coupled transistor devices, the bias circuit includes a current mirror to enable a predetermined minimum bias current to flow though the at least one transistor device when the output switching device is activated and provide a predetermined pull-down current to the at least one transistor device when the output switching device is deactivated.

17. The semiconductor device of claim 16, wherein each transistor device in the gate pull-down circuit is fabricated on an SPWELL area of a semiconductor, the SPWELL area formed within an isolation epitaxial (EPI) region that is formed between an NWELL ring, the isolation EPI region and the NWELL ring form an isolation diode to provide voltage isolation to an adjacent switching channel, wherein a distance between the SPWELL area and the NWELL ring is controlled to a predetermined distance to provide a predetermined isolation voltage range to the adjacent switching channel.

18. The semiconductor device of claim 16, wherein the gate pull-up circuit further comprises:
   a first current source coupled to a voltage source to drive the series of coupled transistor devices, the first current source is switched in response to the enable signal to supply the bias current to the series of coupled transistor devices;
   a second current source coupled to the voltage source to drive the bias circuit, the second current source is switched in response to the enable signal to supply pull-down current to the bias circuit when the output switching device is deactivated; and
   a third current source coupled to the voltage source to drive the at least one transistor device in the gate-pull-down circuit, the third current source is switched in response to the enable signal to supply pull-up current to the at least one transistor device when the output switching device is activated.

19. A semiconductor device comprising:
   an output switching device having an input node, an output node, and a control input node, the control input node enables an input voltage applied to the input node to be switched to the output node;
   a gate pull-down circuit to control the control input node of the output switching device in response to at least one control signal, the gate pull-down circuit employs at least one transistor device to activate the output switching device by raising the voltage level of the control input node above the voltage level of the output node and deactivate the output switching device by clamping the control input node to the voltage level of the output node;

a gate pull-up circuit that receives an enable signal and generates the at least one control signal to the gate pull-down circuit in response to the enable signal; and a slope control circuit in the gate pull-up circuit to control a slope of the rise and fall time of the at least one control signal such that a breakdown voltage of the at least one transistor device is below a predetermined threshold.

20. The semiconductor device of claim 19, further comprising at least one other gate pull-down circuit and at least one other gate pull-up circuit to activate and deactivate at least one other output switching device.

* * * * *